United States Patent [19]

Ohtsuka et al.

[11] Patent Number: 5,327,392
[45] Date of Patent: Jul. 5, 1994

[54] SEMICONDUCTOR INTEGRATED CIRCUIT CAPABLE OF PREVENTING OCCURRENCE OF ERRONEOUS OPERATION DUE TO NOISE

[75] Inventors: Nobuaki Ohtsuka, Yokohama; Sumio Tanaka, Tokyo, both of Japan

[73] Assignee: Kabushiki Kaisha Toshiba, Kawasaki, Japan

[21] Appl. No.: 895,450

[22] Filed: Jun. 8, 1992

Related U.S. Application Data

[63] Continuation of Ser. No. 765,505, Sep. 26, 1991, abandoned, which is a continuation of Ser. No. 444,984, Dec. 4, 1989, abandoned.

[30] Foreign Application Priority Data

Jan. 13, 1989 [JP] Japan ................................ 1-6218

[51] Int. Cl.⁵ .............................................. G11C 8/00
[52] U.S. Cl. ..................... 365/233; 365/194; 365/206; 365/230.03; 365/214; 307/481; 307/594
[58] Field of Search ............... 365/194, 206, 214, 233, 365/230.03; 307/481, 594

[56] References Cited

U.S. PATENT DOCUMENTS

| 4,266,285 | 5/1981 | Panepinto ...................... 365/230.03 |
| 4,296,467 | 10/1981 | Nibby et al. ................... 365/230.03 |
| 4,347,448 | 8/1982 | Plachno ............................. 307/594 |
| 4,573,145 | 2/1986 | Ozawa ............................... 365/233 |
| 4,617,647 | 10/1986 | Hoshi ................................ 365/233 |
| 4,649,521 | 3/1987 | Tsuchida et al. ................... 365/194 |
| 4,766,572 | 8/1988 | Kobayashi ......................... 365/233 |
| 4,794,567 | 12/1988 | Akatsuka .......................... 365/233 |
| 4,819,213 | 4/1989 | Yamaguchi et al. ................ 365/233 |
| 4,882,507 | 11/1989 | Tatsumi et al. ................... 365/194 |
| 4,970,694 | 11/1990 | Tanaka et al. .................... 365/233 |
| 4,974,206 | 11/1990 | Iyama et al. .................. 365/189.01 |
| 5,025,417 | 6/1991 | Miyamoto et al. ............ 365/189.09 |

FOREIGN PATENT DOCUMENTS

250242 12/1987 European Pat. Off. .

OTHER PUBLICATIONS

Motorola Memory Data Manual, Series B, ©1980 Motorola, Inc., pp. 3-27 to 3-30.
National Semiconduictor "Memory Databook," ©1977, MM54C89/MM74C89, pp. 3-1 to 3-4.

Primary Examiner—Joseph E. Clawson, Jr.
Attorney, Agent, or Firm—Finnegan, Henderson, Farabow, Garrett & Dunner

[57] ABSTRACT

A semiconductor integrated circuit includes a circuit block whose operation is controlled by a inverted control signal whose significant potential level is set at a ground potential, and a wiring for transmitting a control signal for controlling the operation of the circuit block. An inverting circuit provided near the circuit block inverts the control signal and then supplies the inverted signal to the circuit block via a wiring. The inverter includes a first capacitor connected between the power source terminal and a node which is set at a high potential level in the inverter circuit when the control signal is set at the non-significant potential level and a second capacitor connected between a ground potential terminal and a node which is set at a ground potential level when the control signal is set at the non-significant potential level.

1 Claim, 4 Drawing Sheets

SEMICONDUCTOR INTEGRATED CIRCUIT CAPABLE OF PREVENTING OCCURRENCE OF ERRONEOUS OPERATION DUE TO NOISE

This application is a continuation of application Ser. No. 07/765,505 filed Sep. 26, 1991 abandoned which is a continuation of Ser. No. 07/444,984, filed Dec. 4, 1989 now abandoned.

BACKGROUND OF THE INVENTION

1. Field of the Invention

This invention relates to a semiconductor integrated circuit, and more particularly to a semiconductor integrated circuit capable of preventing occurrence of erroneous operation due to noise.

2. Description of the Related Art

In the conventional semiconductor integrated circuit, for example, EPROM, write enable signal WE of active-low (that is, which becomes active at a low level) is supplied from write-in control circuit 51 to circuit block 52 as shown in FIG. 1 in view of the arrangement of the memory blocks. Data write-in operation is effected in circuit block 52 in response to signal WE.

FIG. 2 shows the schematic construction of the circuit block 52 of a conventional electrically data programmable nonvolatile semiconductor memory (EPROM). In FIG. 2, memory cells MC1 to MCn are each formed of a memory cell transistor. FIG. 3 is a cross sectional view showing the construction of memory cell MC1. Source 72 and drain 73 formed of n+-type diffusion regions are formed in the surface area of p-type substrate 71, floating gate 74 is formed above that portion of the substrate which lies between the source and drain, and control gate 75 is formed above the floating gate. The film thickness of that portion of insulation film 76 which lies between substrate 71 and floating gate 74 is set to tox1 and the film thickness of that portion of insulation film 76 which lies between floating gate 74 and control gate 75 is set to tox2.

Since the EPROM is a nonvolatile memory, data programed into memory cell MC1 can be permanently stored unless all the stored data is erased by application of ultraviolet rays. In this case, the "data programming" means that electrons are injected into floating gate 74 of memory cell MC1 and data of the memory cell is set to "0". That is, memory cell MC1 having data of "1" is not programmed and set in the erasing state in which no electron is injected into floating gate 74 of the memory cell MC1. For this reason, in order to program data into the memory cell, high voltage for programming is simultaneously applied to drain 73 and control gate 75 of the memory cell which is desired to store data "0", thereby causing hot electrons to be injected into the floating gate from the channel between drain 73 and source 72. As a result, the threshold voltage of the programmed memory cell transistor is raised and thus data is programmed into memory cell MC1 of the EPROM. The programming operation is effected by use of an exclusive-use device which is called an EPROM writer. The EPROM is mounted on a device using the EPROM after the programming operation.

In the readout mode, voltage Vcc of 5 V, for example, is applied to control gate 75 to read out data stored in memory cell MC1.

As described above, in the EPROM, the level of a voltage applied to control gate 75 when data is programmed into data storing memory cell MC1 is different from that applied when data is read out from the memory cell. For example, voltage Vcc (5 V) is applied in the data readout operation, and voltage Vpp (12.5 V) is applied in the data programming operation. Therefore, it is necessary to provide a switching circuit for switching voltages Vcc and Vpp in addition to externally supplied power source voltages Vcc (5 V), Vpp (12.5 V) and Vss (0 V).

As shown in FIG. 2, the switching between voltages Vcc and Vpp is effected by use of voltage switching circuit 102. Switching circuit 102 is supplied with normal data readout voltage vcc via terminal 142 and data programming high voltage Vpp via terminal 144 and selectively supplies voltage Vcc or Vpp as voltage SW according to an programming control signal (write enable signal). Voltage Vpp is also supplied to programming control section 104. Programming control section 104 includes transistor 134 whose drain and source are respectively connected to terminal 144 and column selection gate circuit 108 and programming control buffer 132 connected to receive voltage vpp as a power source voltage for controlling the gate voltage of transistor 134 according to programming data Din.

Column decoder 106 decodes a column address included in the input address to output the decoded result to column selection gate circuit 108. Circuit 108 includes a plurality of N-channel MOS transistors and selects memory cell MC1 based on the decoded result of decoder 106. Row decoder 110 decodes a row address included in the input address to output the decoded result to row address buffer 112. Buffer 112 is supplied with voltage SW from circuit 102 as the power source voltage and supplies a voltage to control gate 75 of memory cell MC1.

The drain and source of memory cell MC1 are respectively connected to ground voltage terminal Vss and bit line 120. Bit line 120 is connected to one input terminal of sense amplifier 116 via a plurality of transistors of column selection gate circuit 108. Sense amplifier 116 senses "1" or "0" of data stored in memory cell MC1 by comparing the potential of bit line 120 varying according to data stored in one of memory cells MC1 selected by row decoder 110 and column decoder 106 with an input reference voltage to be described later.

Reference voltage generation circuit 122 supplies a reference voltage to sense amplifier 116. Circuit 122 includes dummy cell DC constructed by the same memory cell transistor as memory cell MC1, dummy bit line 118 and column selection gate circuit 114 having normally turned-on transistors of the same number as the transistors series-connected in column selection gate circuit 108. The level of the reference voltage is determined by turning on dummy cell DC. In order to obtain a stable reference potential, it is necessary to design the transistor characteristics of memory cell MC1 and dummy cell DC equal to each other.

With the above construction, when data is programmed into memory cell MC1, high voltage Vpp is supplied as voltage SW from power source switching circuit 102 to row address buffer circuit 112. At the same time, high voltage Vpp is supplied from programming controlling buffer 132 to the gate of programming controlling transistor 134. If the threshold voltage of transistor 134 is Vth, a voltage of (Vpp-Vth) is supplied to the drain of memory cell MC1 via column selection gate circuit 108. Further, high voltage Vpp is supplied from row address buffer 112 to the control gate of memory cell MC1. As a result, current flows in the source-drain path of memory cell MC1, causing hot electrons to be injected into floating gate 74 to raise the threshold voltage of memory cell MC1. In this way, data is programmed into memory cell MC1.

When data is read out from memory cell MC1, voltage Vcc is supplied as voltage SW from power source switching circuit 102 to row address buffer 112. At this time, voltage Vcc is supplied from row address buffer 112 to the control gate of memory cell MC1, permitting a voltage corresponding to data stored in memory cell MC1 to be supplied to sense amplifier 116 via column selection gate circuit 108. A reference voltage is also supplied from reference voltage generating circuit 122 to sense amplifier 116. Then, sense amplifier 116 compares the voltage supplied from memory cell MC1 with that supplied from dummy cell DC and outputs the comparison result as readout data to the data line.

It is necessary to remove the EPROM into which data has been written or programmed from the socket of the writer and insert the same into the socket on a board of a device on which the EPROM is to be mounted. In this case, an electrostatic serge may be applied to pins of the EPROM while the EPROM is removed from the socket, transferred and inserted into another socket. A protection circuit is provided to protect the internal circuit from being damaged by an externally applied serge. However, there is a possibility that data may be erroneously programmed into the memory cell in a case where a surge is applied to a vpp power source pin. Now, the erroneous data write-in or programming is explained.

FIG. 4 shows the construction of power source switching circuit 102 provided in circuit 52 of FIG. 2. MOS transistors 53 and 54 are each formed of a depletion type N-channel MOS transistor. The drains of transistors 53 and 54 are respectively connected to Vpp power source terminal 144 and Vcc power source terminal 142, and the sources thereof are commonly connected to node 23. As described before, voltage SW at node 23 is applied to the control gate of memory cell MC1 and the like. Signal SW is directly supplied to the gate of transistor 54 and to the gate of transistor 53 via potential conversion circuit 58. Potential conversion circuit 58 serves to convert a Vcc system signal ("H"=5 V, "L"=0 V) into a Vpp system signal ("H"=Vpp, "L"=0 V) and is supplied with Vpp and ground voltage Vss (0 V) as a power source voltage.

One of Vpp and Vcc power source voltages is selected by means of voltage switching circuit 102 in response to signal WE. In voltage switching circuit 102, signal WE is set at logic level "L" and an output of potential conversion circuit 58 is set to logic level "H" in the data write-in mode. As a result, high voltage Vpp is applied to the gate of transistor 53 to turn on the same. Further, signal WE of logic level "L" is directly applied to the gate of transistor 54 to turn off the same. Therefore, high voltage Vpp is transmitted to node 23 via transistor 53, thereby applying high voltage Vpp to the control gate of memory cell MC1. In contrast, in the readout mode, transistor 54 is turned on and transistor 53 is turned off, causing voltage Vcc to be supplied to node 23 via transistor 54. As a result, voltage Vcc is applied to the control gate of memory cell MC1.

Assume now that a serge is applied to the Vpp power source terminal and the potential thereof is raised when all the pins of the EPROM are set in the electrically floating state. In this case, in power source voltage switching circuit 102 of FIG. 4, parasitic capacitor C1 exists between the drain and gate of transistor 53 and therefore the gate potential of transistor 53 is also raised to a high potential by capacitive coupling. As a result, transistor 53 is turned on to raise the potential of node 23. Further, since parasitic capacitor C2 exists between the source and gate of transistor 54, transistor 54 is also turned on in the same manner as in the case of transistor 53 and the potential of power source Vcc supplying terminal 142 which is externally set in the floating state is raised to a high potential level.

When a voltage at terminal 142 is raised to a certain level, for example, 2.5 V, the internal circuit starts to effect the normal operation. Even when the internal circuit starts to effect the normal operation and a high voltage is applied to terminal 144, the write-in mode cannot be always set because the other control pins are still in the floating state and the potential thereof is not determined. However, the potential level to which the potential of each node of the internal circuit is transiently set by means of the above-described parasitic capacitor of the transistor when the potential of terminal 142 is raised cannot be determined, and there is a possibility that the internal circuit is set into the write-in mode irrespective of the input potential of the control pins. In this case, the potentials of the drain and control gate of a memory cell designated by an address which happens to be internally set up are raised to a high potential level, causing electrons to be injected into the control gate and effecting the data write-in operation.

Application of a serge is effected instantaneously and therefore time in which the memory cell is kept in the write-in state cannot be always sufficiently long in comparison with the ordinary write-in time. Further, the potential of node 23 cannot be always sufficiently high for the data write-in operation depending on the potential level by which the potential of the gate of transistor 53 is raised. However, even if the write-in time, and the potentials of the drain and control gate of the memory cell are insufficient, the threshold voltage of the memory cell will be changed if electrons are injected into the floating gate. In this case, if variation in the threshold voltage is large so that data "1" can be stored into the memory cell, data of the memory cell which should be set in the erased state is changed to "0", causing a serious error. Further, even if variation in the threshold voltage is small, it becomes difficult to read out data "1", causing the access time in the data readout mode to be degraded.

The above problems may easily occur in a case where signal WE whose "L" level is significant (active) is supplied to a circuit block. As the length of a wiring for transferring signal WE becomes longer, the capacitor between the wiring and the substrate becomes larger. As a result, the potential of the wiring tends to be pulled down to the substrate potential or ground potential by means of the capacitive coupling between the wiring and the substrate. Therefore, when the length of the wiring is long, even if write enable signal WE is set to "H" level, signal WE tends to be pulled down to the ground potential, thereby setting the write enable state. As a result, there is a high possibility that the internal circuit is set into the write-in state when the internal circuit is instantaneously operated by a serge as described before.

Further, in an ordinary semiconductor integrated circuit as well as an EPROM, a control signal whose "L" level is set as a significant potential level tends to be pulled to "L" level potential by the capacitive coupling between the wiring and the substrate in a case where the control signal of "H" level is transmitted along the wiring formed on the substrate set at the ground potential and in this case the internal circuit may be erroneously operated.

SUMMARY OF THE INVENTION

This invention has been made in view of the above fact, and an object of this invention is to provide a semiconductor integrated circuit capable of preventing occurrence of erroneous operation due to noise.

In order to achieve the object, the semiconductor integrated circuit comprises a circuit block whose operation is controlled by a first control signal whose significant potential level is set at a ground potential; a wiring for transmitting a second control signal whose significant potential level is set at a potential level corresponding to a power source voltage; a controller for supplying the second control signal to said wiring; and an inverter provided near said circuit block, for inverting the second control signal on said wiring to obtain the first control signal and then supplying the first control signal to said circuit block.

As described above, according to this invention, a semiconductor integrated circuit in which occurrence of an erroneous operation due to noise can be suppressed can be provided.

DETAILED DESCRIPTION OF THE PREFERRED EMBODIMENTS

There will now be described a semiconductor integrated circuit according to one embodiment of this invention with reference to the accompanying drawings.

Figure 1:
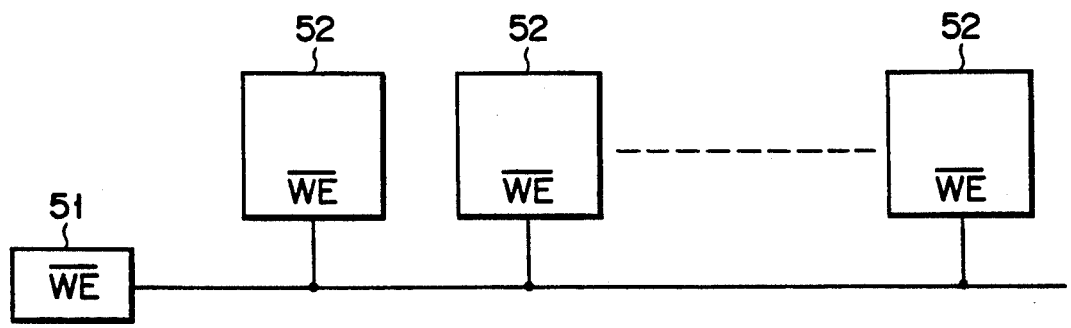
FIG. 1 is a circuit diagram of the conventional semiconductor integrated circuit.
Figure 3:
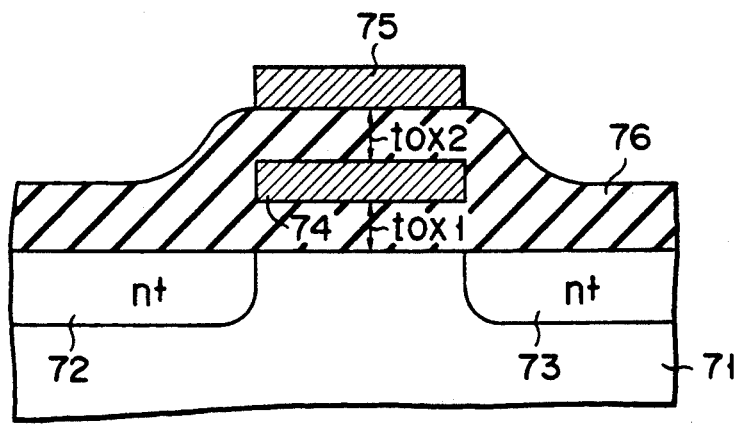
FIG. 3 is a cross sectional view showing the construction of a memory cell shown in FIG. 2.
Figure 2:
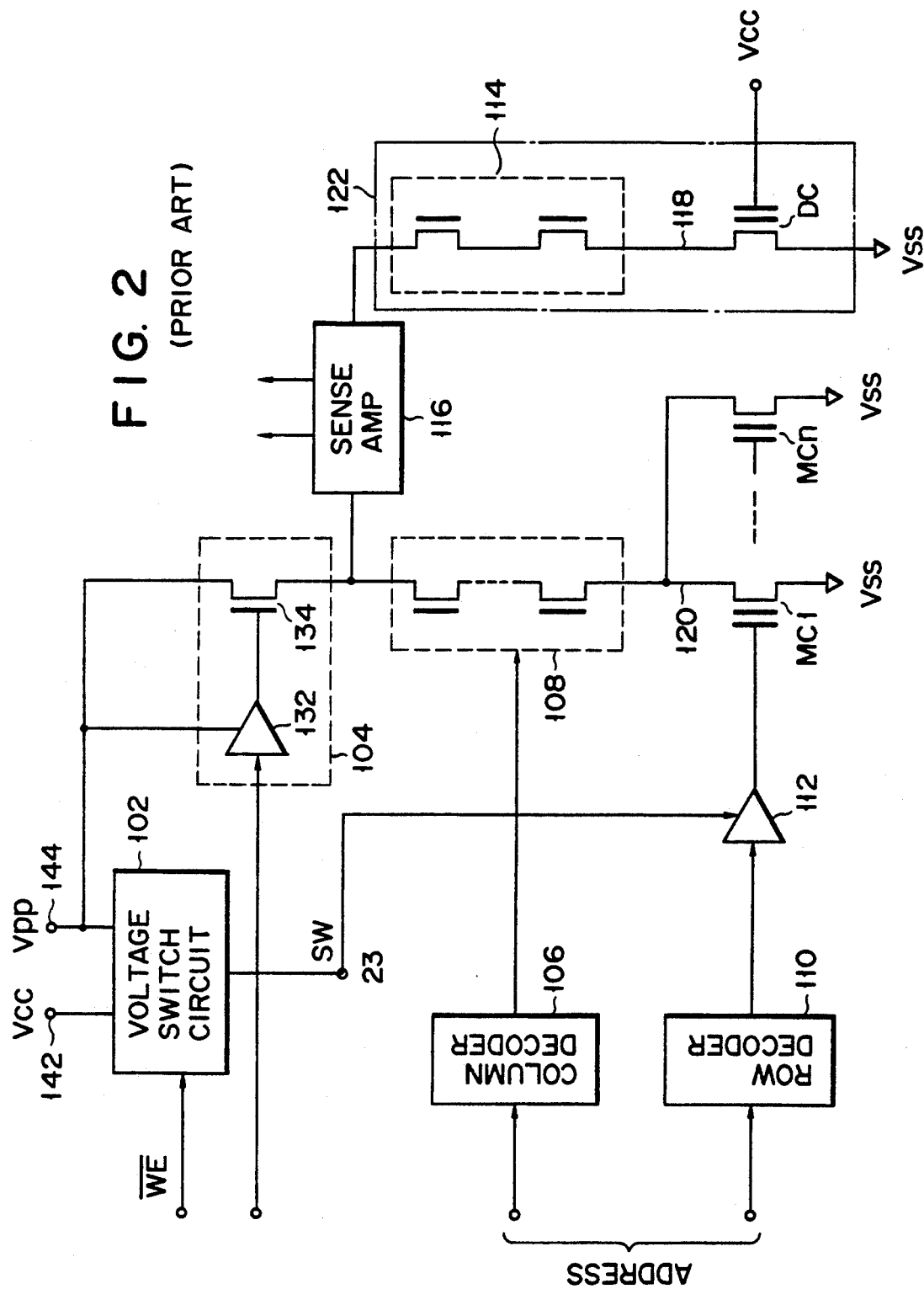
FIG. 2 is a block diagram showing the schematic construction of the circuit block 52 of the conventional EPROM.
Figure 5:
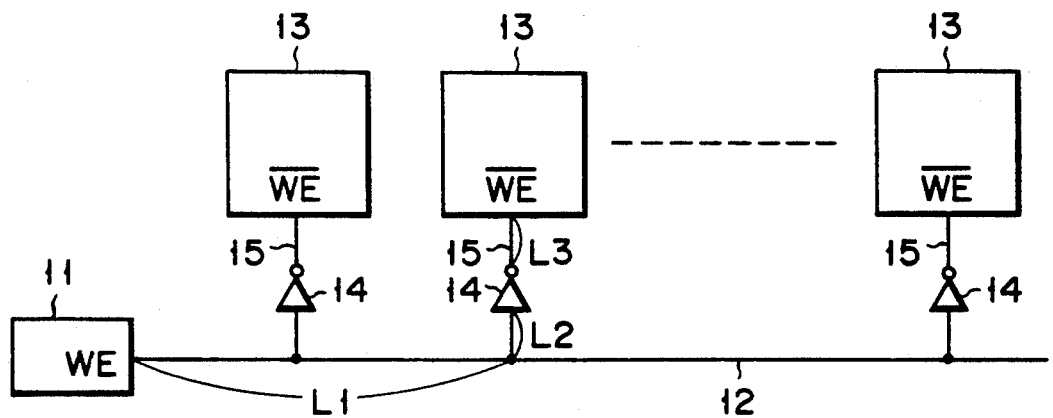
FIG. 5 is a block diagram of a semiconductor integrated circuit according to one embodiment of this invention.

FIG. 5 is a block diagram showing the construction of circuit block 13 (like the circuit block shown in FIG. 2) in an EPROM whose operation is controlled by write enable signal WE and to which this invention is applied. The significant potential level of write enable signal WE output from write-in control circuit 11 is set at "H" and the non-significant potential level thereof is set at "L", and signal WE is transmitted to a position near circuit blocks 13 via wiring 12. Signal WE transmitted to the above position is then supplied to circuit blocks 13 via respective inverter circuits 14. Since the operation of each circuit block 13 is controlled by write enable signal $\overline{W}$ in the same manner as in the conventional case, each circuit block 13 is set into the write-in mode when write enable signal WE output from write-in control circuit 11 is set at "H" level and set into the non-write mode when signal WE is set at "L" level.

Length (Li+L2) of the wiring between write-in control circuit 11 and inverter circuit 14 is larger than length L3 between inverter circuit 14 and circuit block 13. Since the significant potential level of a control signal transmitted via wiring 12 is set at "H" level, even if the potential of the control signal is nearly set to "L" level by the influence of the substrate set at the ground potential, occurrence of the erroneous operation due to noise of electrostatic serge can be prevented.

Figure 6:
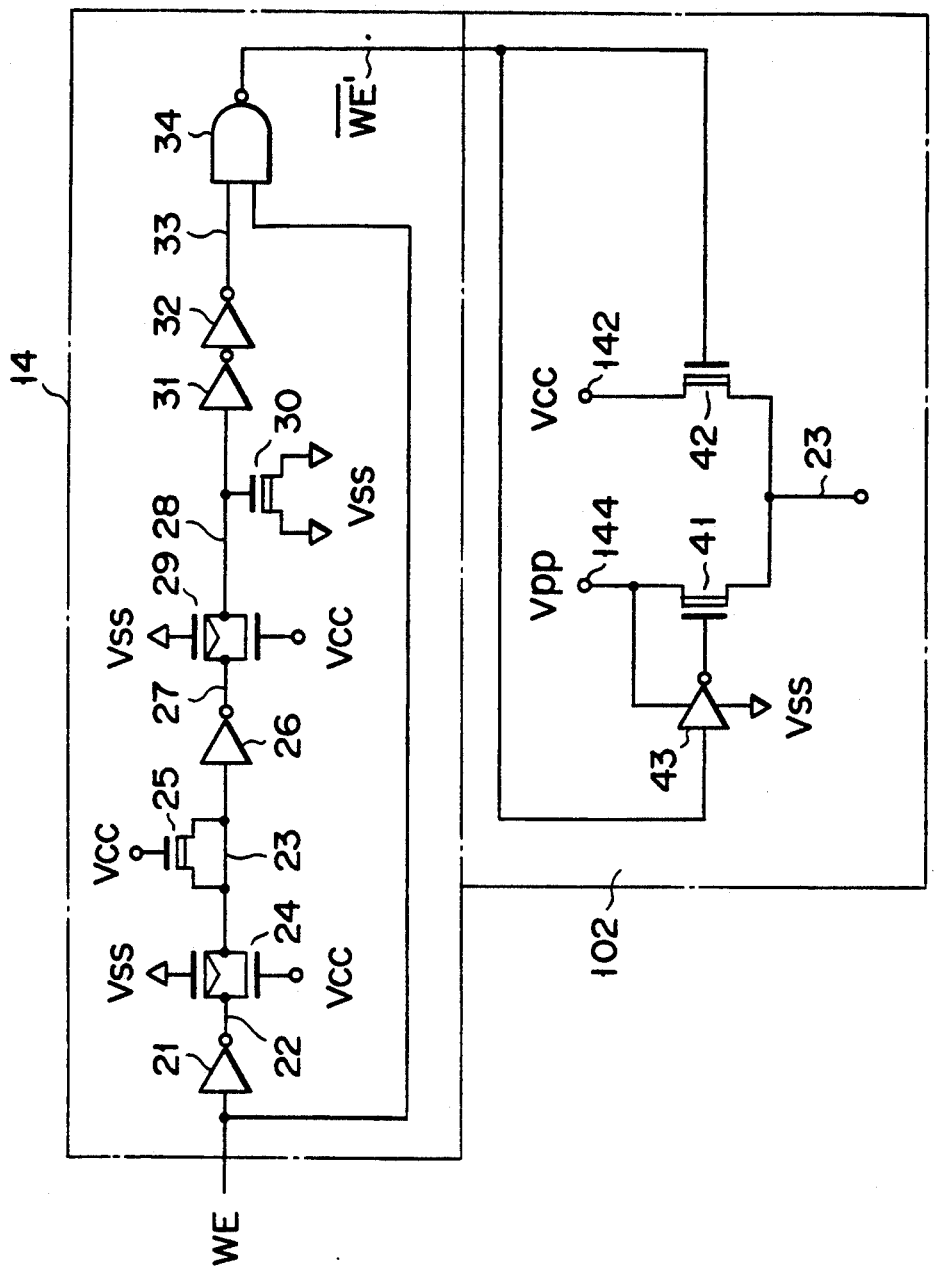
FIG. 6 is a circuit diagram specifically showing part of the semiconductor integrated circuit of FIG. 5.

FIG. 6 is a circuit diagram showing the construction of inverter circuit 14 and power source voltage switching circuit 102 arranged in a specified one of circuit blocks 13, for selecting one of power source voltage Vpp and power source voltage Vcc according to an output signal of inverter circuit 14.

Inverter circuit 14 includes inverter 21 for inverting signal WE transmitted along wiring 12. CMOS transfer gate 24 is connected between output node 22 of inverter 21 and node 23 and acts as a resistor. Depletion type MOS transistor 25 has a source and a drain both connected to node 23 and a gate connected to power source terminal Vcc and acts as a capacitor. Inverter 26 inverts a signal on node 23. CMOS transfer gate 29 is connected between output node 27 of inverter 27 and node 28 and acts as a resistor. Depletion type MOS transistor 30 has a gate connected to node 28 and a source and a drain both connected to power source terminal Vss and acts as a capacitor. Inverter 31 inverts a signal on node 28. An output of inverter 31 is inverted by inverter 32. A signal on output node 33 of inverter 32 is supplied together with signal WE to NAND gate 34 to obtain a write-in control signal $\overline{WE}'$.

Figure 4:
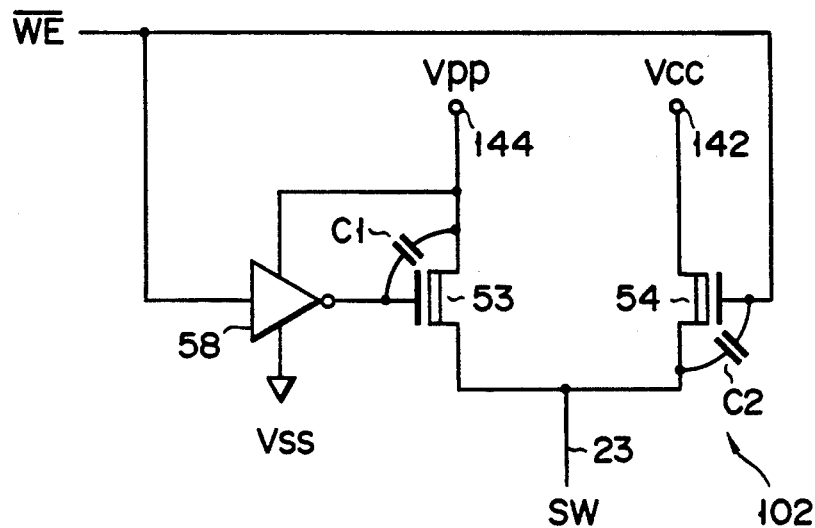
FIG. 4 is a circuit diagram specifically showing part of the conventional semiconductor integrated circuit of FIG. 1.

Further, in the same manner as in the case of FIG. 4, power source voltage switching circuit 102 includes two depletion type N-channel MOS transistors 41 and 42 and potential converting circuit 43. The drains of transistors 41 and 42 are respectively connected to power source terminals Vpp and Vcc and the sources of transistors 41 and 42 are commonly connected to node 23. A voltage on node 23 is supplied to the control gate of memory cell MC1 in the circuit block. The gate of transistor 42 is supplied with output signal WE' of AND gate 34 which is an output signal of inverter circuit 14 and the gate of transistor 41 is supplied with signal WE' via potential converting circuit 43. In the same manner as in the conventional case, potential converting circuit 43 functions to convert a Vcc system signal into a Vpp system signal and supplied with voltage Vpp and ground voltage Vss as a power source voltage.

Inverter circuit 14 of the above construction functions as a delay circuit for input signal WE. That is, a signal on node 23 driven by inverter 21 is delayed by an RC delay circuit constituted by transfer gate transistor 24 and transistor 25 and supplied to inverter 26. Further, a signal on node 28 driven by inverter 26 is delayed by an RC delay circuit constituted by transfer gate transistor 29 and transistor 30 and supplied to inverter 31. Therefore, output signal $\overline{WE}$40 of NAND gate circuit 34 is changed from "H" level to "L" level after input signal WE is changed from "L" level to "H" level. However, since the write-in or programming time is as long as several seconds in the write-in mode in comparison with the readout time which is several nanoseconds in the readout mode of the EPROM, the delay in signal $\overline{WE}'$ will not give serious influence to the write-in operation.

Further, since output signal $\overline{WE}$ of inverter circuit 14 is varied with delay time with respect to variation in input signal WE, a filtering effect of removing noise introduced into input signal WE can be obtained.

In inverter circuit 14, transistor 25 acting as a capacitor is connected between node 23 and power source terminal Vcc. Node 23 is a node whose potential is set to "H" level by an output signal of inverter 21 when input signal WE is in the non-significant state or at "L" level. The presence of transistor 25 connected between node 23 and power source terminal vcc makes it difficult to pull the potential of node 23 to "L" level. Further, transistor 30 acting as a capacitor is connected between node 28 and ground voltage terminal vss. Node 28 is a node whose potential is set to "L" level by an output signal of inverter 26 when input signal WE is in the non-significant state or at "L" level. The presence of transistor 30 connected between node 28 and ground voltage terminal Vss makes it difficult to pull the potential of node 28 to "H" level. When node 23 is set at "H" level and node 28 is set at "L" level, a state corresponding to the non-write state is set up and therefore power source voltage switching circuit 102 tends to be set into the non-write mode.

Now, assume that an electrostatic serge is applied to power source terminal 144 as described before. Even if voltage terminal Vpp set in the electrically floating state is raised by application of the serge, thereby causing the internal circuit to be operated, nodes 23 and 28 in inverter circuit 14 are fixed in the non-write state. As a result, power source voltage switching circuit 102 will not be erroneously operated so that the potential of node 23 can be prevented from being raised and erroneous data write-in can be prevented.

The reason why depletion type transistors are used as transistors 25 and 30 each acting as a capacitor in inverter circuit 14 is that the threshold voltage thereof is negative, a channel is always formed under the gate irrespective of the potential of nodes 25 and 30, and the capacitance of the capacitor can be made larger than in the case where an enhancement type transistor is used.

This invention is not limited to the above embodiment, and various modifications can be made. For example, in the above embodiment, this invention is applied to the circuit system whose operation is controlled by a write enable signal of the EPROM. However, this invention can be applied to a circuit system whose operation can be controlled by one of various signals used in the semiconductor integrated circuit, for example, a test mode signal for effecting a stress test.

What is claimed is:

1. A semiconductor integrated circuit comprising:
a plurality of memory blocks, each of the memory blocks having a plurality of memory cells, and each of the memory cells storing data in response to a write enable signal at ground potential;
control means for generating a control signal set at a power source potential when the memory blocks store data;
a plurality of first wirings for supplying the control signal generated by the control means to the memory blocks;
a plurality of inverting means, each of the inverting means being located near and corresponding to a respective one of the memory blocks, for inverting control signals supplied to the memory blocks by the plurality of first wirings, thereby generating write enable signals; and
a plurality of second wirings for supplying the write enable signals generated by the inverting means to the memory blocks, each of the second wirings being shorter than a portion of each of the first wirings coupled between the control means and the inverting means, wherein each of the inverting means includes:
a first inverter for inverting the control signal applied to the memory blocks by the plurality of first wirings,
a first transfer gate couple between a first node and an output of the first inverter,
a first depletion-type MOS transistor having a source and a drain coupled to the first node, and a gate coupled to a power-source potential terminal, the first depletion-type MOS transistor functioning as a first capacitor,
a second inverter for inverting a signal at the first node,
a second transfer gate coupled between a second node and an output of the second inverter, a second depletion-type MOS transistor having a source and a drain coupled to a ground-potential terminal, and a gate coupled to the second node, the second depletion-type MOS transistor functioning as a second capacitor, and
a NAND gate for generating a logic NAND of a signal at the second node and the control signal, thereby generating a write enable signal.

* * * * *